(12) United States Patent
Nelson

(10) Patent No.: US 8,466,728 B2
(45) Date of Patent: Jun. 18, 2013

(54) ENHANCED DELAY MATCHING BUFFER CIRCUIT

(75) Inventor: Dale Nelson, Macungie, PA (US)

(73) Assignee: Agere Systems LLC, Allentown, PA (US)

( * ) Notice: Subject to any disclaimer, the term of this patent is extended or adjusted under 35 U.S.C. 154(b) by 1573 days.

(21) Appl. No.: 11/360,201

(22) Filed: Feb. 23, 2006

(65) Prior Publication Data

US 2007/0194815 A1    Aug. 23, 2007

(51) Int. Cl.
*H03H 11/26* (2006.01)

(52) U.S. Cl.
USPC .......................................... 327/261; 327/262

(58) Field of Classification Search
USPC .................. 365/194; 327/261–290, 136, 149,
327/153, 158, 161, 163, 175, 231, 237–253,
327/333
See application file for complete search history.

(56) References Cited

U.S. PATENT DOCUMENTS

| | | | | |
|---|---|---|---|---|
| 5,303,191 | A * | 4/1994 | Eagan et al. | 365/194 |
| 6,605,963 | B2 * | 8/2003 | Kitamoto et al. | 326/81 |
| 6,987,407 | B2 * | 1/2006 | Chung et al. | 327/158 |
| 2001/0045856 | A1 * | 11/2001 | Ooishi | 327/277 |
| 2004/0150447 | A1 * | 8/2004 | Chang | 327/175 |
| 2005/0270078 | A1 * | 12/2005 | Santou | 327/276 |
| 2006/0066381 | A1 * | 3/2006 | Bhattacharya et al. | 327/333 |
| 2006/0284662 | A1 * | 12/2006 | Suda et al. | 327/261 |

OTHER PUBLICATIONS

Hara, H. et al., "0.5-mm 3.3-V BiCMOS Standard Cells with 32-kilobyte Cache and Ten-Port Register File,", Nov. 1992, IEEE Journal of Solid-State Circuits, vol. 27, No. 11.*

* cited by examiner

*Primary Examiner* — Lincoln Donovan
*Assistant Examiner* — Diana J Cheng
(74) *Attorney, Agent, or Firm* — Ryan, Mason & Lewis, LLP

(57) ABSTRACT

A buffer circuit includes an input stage including at least one MOS device having a first threshold voltage associated therewith, the input stage being adapted to receive an input signal referenced to a first voltage supply. The buffer circuit further includes an output stage including at least one MOS transistor having the first threshold voltage associated therewith, an input of the output stage being connected to an output of the input stage, the output stage being operative to generate an output signal which is indicative of a logic state of the input signal. The buffer circuit includes a delay control circuit adapted for connection between at least one of the first voltage supply and a voltage return of the buffer circuit, and at least one of the input stage and the output stage. The delay control circuit includes at least one MOS device having a second threshold voltage associated therewith. The MOS device in the delay control circuit being adapted to receive, as a control signal, a second voltage supply, a delay of the buffer circuit being at least partially controlled as a function of a process parameter, the second voltage supply and/or a temperature of the MOS device in the delay control circuit.

14 Claims, 3 Drawing Sheets

ENHANCED DELAY MATCHING BUFFER CIRCUIT

FIELD OF THE INVENTION

The present invention relates generally to electronic circuits, and more particularly relates to buffer circuits.

BACKGROUND OF THE INVENTION

Many electronic devices employ buffers to interface with external signals. These buffers have certain respective delays associated therewith. In applications where an internal matching buffer is required to match the delay of an input buffer that brings an external signal inside of a semiconductor chip, achieving good matching over process, supply voltage, and temperature (PVT) variations to which the chip may be subjected is often difficult. One exemplary application in which it is desirable to use an internal matching buffer is for phase alignment in a phase-locked loop (PLL) circuit, where the chip level design requires the removal of clock tree build-up delay and/or removal of the delay of the reference clock input buffer delay.

In many earlier technologies, core logic circuitry typically operated at the same supply voltage as input/output (IO) circuitry and used the same type of transistors. In this instance, the circuitry of the input buffer was mimicked by the matching buffer so as to provide good delay matching. Using modern technology, however, the core logic circuitry often operates at a lower supply voltage than the IO circuitry. Moreover, core logic circuitry, as may be used in the matching buffer, typically employs transistors having a low threshold voltage associated therewith, often referred to as low-voltage transistors, while IO circuitry, as may be used in the input buffer, employs transistors having a high threshold voltage associated therewith, often referred to as high-voltage transistors. Because of the different supply voltages at which the two types of transistors operate and the different process parameters associated with the two types of transistors, correlation between the IO circuitry and the core logic circuitry is typically difficult to achieve without performing a costly trimming procedure and/or adding internal delay matching circuitry (e.g., matching buffer).

In multiple voltage supply applications, one known matching methodology might involve using the same circuitry for both the input buffer and the matching buffer, to thereby provide correlation between the input buffer and the matching buffer, and to utilize voltage level translation circuitry for translating between the core voltage used by the core logic circuitry and the IO voltage used by the IO circuitry. This technique, however, suffers from the added delay introduced by the voltage level translation itself, which will cause some degree of mismatch. Another technique is to design the overall system to match an average delay and then to accommodate for the differences in the two delays by increasing the chip timing budget. This technique, however, can undesirably increase chip gate count per unit area and can decrease the maximum speed at which the chip can function reliably.

Accordingly, there exists a need for an improved buffer circuit architecture for providing enhanced delay matching, which does not suffer from one or more of the problems exhibited by conventional buffer circuit architectures.

SUMMARY OF THE INVENTION

The present invention meets the above-noted need by providing, in an illustrative embodiment thereof, a buffer circuit architecture suitable for use in a multiple supply voltage application and which provides enhanced delay matching compared to conventional buffer circuit arrangements.

In accordance with one aspect of the invention, a buffer circuit includes an input stage including at least one MOS device having a first threshold voltage associated therewith, the input stage being adapted to receive an input signal referenced to a first voltage supply. The buffer circuit further includes an output stage including at least one MOS transistor having the first threshold voltage associated therewith, an input of the output stage being connected to an output of the input stage, the output stage being operative to generate an output signal which is indicative of a logic state of the input signal. The buffer circuit includes a delay control circuit adapted for connection between at least one of the first voltage supply and a voltage return of the buffer circuit, and at least one of the input stage and the output stage. The delay control circuit includes at least one MOS device having a second threshold voltage associated therewith, the second threshold voltage being greater than the first threshold voltage. The MOS device in the delay control circuit being adapted to receive, as a control signal, a second voltage supply, a delay of the buffer circuit being at least partially controlled as a function of a process parameter, the second voltage supply and/or a temperature of the MOS device in the delay control circuit.

These and other features and advantages of the present invention will become apparent from the following detailed description of illustrative embodiments thereof, which is to be read in connection with the accompanying drawings.

DETAILED DESCRIPTION OF THE INVENTION

The present invention will be described herein in the context of illustrative matching buffer circuits for use, for example, in a PLL circuit. It should be understood, however, that the present invention is not limited to this or any other particular buffer circuit and/or application. Rather, the invention is more generally applicable to an improved buffer circuit for providing enhanced delay matching between the buffer circuit and a second buffer adapted to interface with external signals. Moreover, the techniques of the present invention essentially eliminate the need for additional delay matching circuitry and/or the need for increasing a timing budget of the circuit in which the buffer circuit is employed. Although implementations of the present invention are described herein with specific reference to p-channel metal-oxide-semiconductor (PMOS) and n-channel metal-oxide-semiconductor (NMOS) transistor devices, as may be formed using a complementary metal-oxide-semiconductor (CMOS) fabrication process, it is to be understood that the invention is not limited to such transistor devices and/or such a fabrication process, and that other suitable devices, such as, for example, bipolar junction transistors (BJTs), etc., and/or fabrication processes (e.g., bipolar, BiCMOS, etc.), may be similarly employed, as will be apparent to those skilled in the art.

Figure 1:
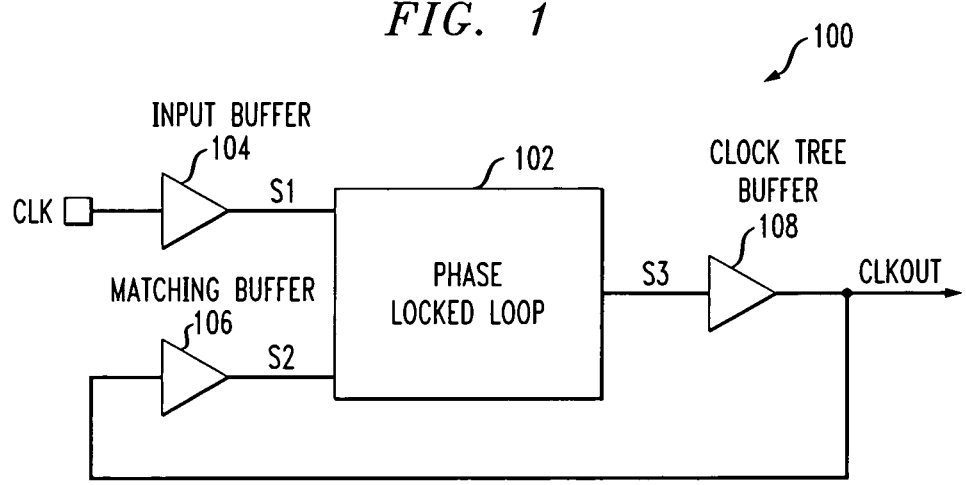
FIG. 1 is a block diagram depicting an exemplary clock distribution circuit application in which the techniques of the present invention may be implemented.

FIG. 1 is a block diagram depicting an illustrative clock distribution circuit 100 in which the techniques of the present invention can be implemented. The clock distribution circuit 100 includes a PLL 102, an input buffer 104, a matching buffer 106 and a clock tree buffer 108. The input buffer 104 includes an input for receiving a reference clock signal, CLK, presented to the clock distribution circuit 100 and an output for generating a first signal, S1, which is preferably a buffered version of the reference clock signal. The PLL 102 includes a first input for receiving signal S1, a second input for receiving a second signal, S2, generated by the matching buffer 106, and an output for generating a signal, S3, which is a function of a phase difference and/or a frequency difference between signals S1 and S2 presented to the PLL. PLL 102 may comprise standard functional components, such as, for example, a phase/frequency comparator, a loop filter and a voltage-controlled oscillator (not explicitly shown) connected in a conventional manner, as will be known by those skilled in the art.

Clock tree buffer 108 preferably includes an input for receiving signal S3 generated by the PLL 102 and an output for generating an output signal, CLKOUT, of the clock distribution circuit 100. Output signal CLKOUT, or some division thereof, is fed back to an input of matching buffer 106. The PLL 102 adjusts the frequency of the output signal CLKOUT as necessary so as to substantially match a frequency of CLKOUT to a frequency of the reference clock signal CLK, or a division thereof. The output signal CLKOUT may be used, for example, in a clock tree architecture to distribute the reference clock throughout an integrated circuit.

In the clock distribution circuit 100, edges of the output signal CLKOUT generated by the clock tree buffer 108 should be substantially aligned with edges of the reference clock CLK applied to the input of the input buffer 104. Since the PLL 102 functions to align the edges (e.g., rising edges or falling edges) of the two signals S1 and S2 presented to the PLL, a matching buffer having a delay which is ideally equal to a delay of the input buffer is beneficial for providing proper alignment. Conventionally, this has not been a problem when the input buffer 104, the PLL 102, the matching buffer 106 and the clock tree buffer 108 all operate from the same supply voltage.

Figure 2:
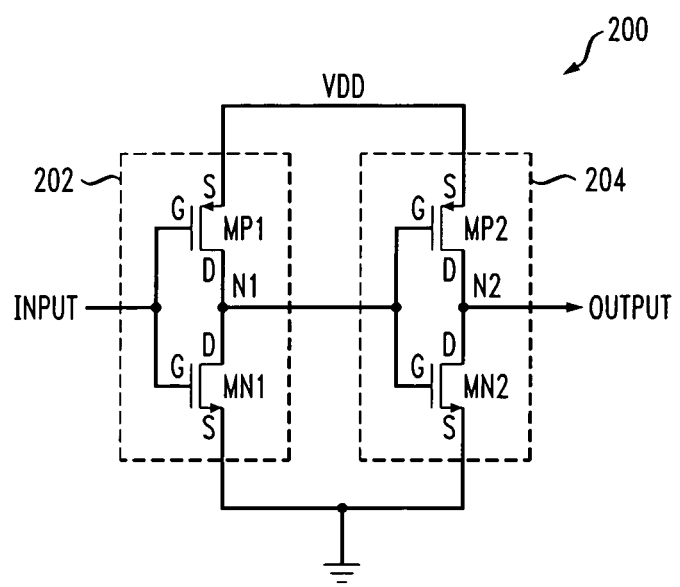
FIG. 2 is a schematic diagram depicting an illustrative buffer circuit suitable for use in a single supply voltage application.

FIG. 2 depicts an exemplary buffer circuit 200 which can be used to implement both the input buffer 104 and the matching buffer 106 shown in FIG. 1 in a single supply voltage application. The buffer circuit 200 includes a first inverter 202 comprising a PMOS device, MP1, and a NMOS device, MN1, connected together in a conventional fashion. Specifically, a source (S) of MP1 is connected to supply voltage, VDD, a source of MN1 is connected to ground, drains (D) of MP1 and MN1 are connected together to form an output of the first inverter 202 at node N1, and gates (G) of MP1 and MN1 are connected together to form an input of the buffer circuit 200. The buffer circuit 200 further includes a second inverter 204 comprising a PMOS device, MP2, and a NMOS device, MN2, connected together in a conventional fashion. Specifically, a source of MP2 is connected to supply voltage VDD, a source of MN2 is connected to ground, drains of MP2 and MN2 are connected together to form an output of the buffer circuit 200 at node N2, and gates of MP2 and MN2 are connected to the output of the first inverter at node N1.

In a single supply voltage application, the input buffer 104 and matching buffer 106 (depicted in FIG. 1) can be formed in a nearly identical manner using the same type of transistors. Consequently, the respective delays of the input buffer and matching buffer will be substantially the same. Moreover, since the same type of transistor is used in both buffers, the respective delays of each buffer will substantially track one another with variations in PVT conditions to which the buffers may be subjected. In multiple supply voltage applications, however, matching the delay of the matching buffer to the delay of the input buffer is difficult to achieve.

In a multiple supply voltage application, IO circuitry (e.g., input buffer 104) used to interface with external signals typically operates at a higher IO supply voltage, such as, for example, 3.3 volts, compared to core logic circuitry (e.g., PLL 102, matching buffer 106, clock tree buffer 108) which often operates at a substantially lower core logic supply voltage, such as, for example, 1.0 volt. This allows low-voltage transistors to be utilized in the core logic circuitry, which are generally faster than high-voltage transistors employed in the IO circuitry. For example, with reference to FIG. 2, buffer circuit 200, when implementing input buffer 104 (FIG. 1), preferably utilizes high-voltage PMOS devices for MP1 and MP2 and high-voltage NMOS device for MN1 and MN2, and VDD in this case would be the higher IO supply voltage. As previously stated, the same circuitry can be used for both the input buffer and the matching buffer, to thereby provide correlation between the input buffer and the matching buffer, with the addition of voltage level translation circuitry for translating between the core logic supply voltage used by the core logic circuitry and the IO supply voltage used by the IO circuitry. However, this technique suffers from the added delay introduced by the voltage level translation circuitry itself, which will cause some degree of mismatch.

Figure 3:
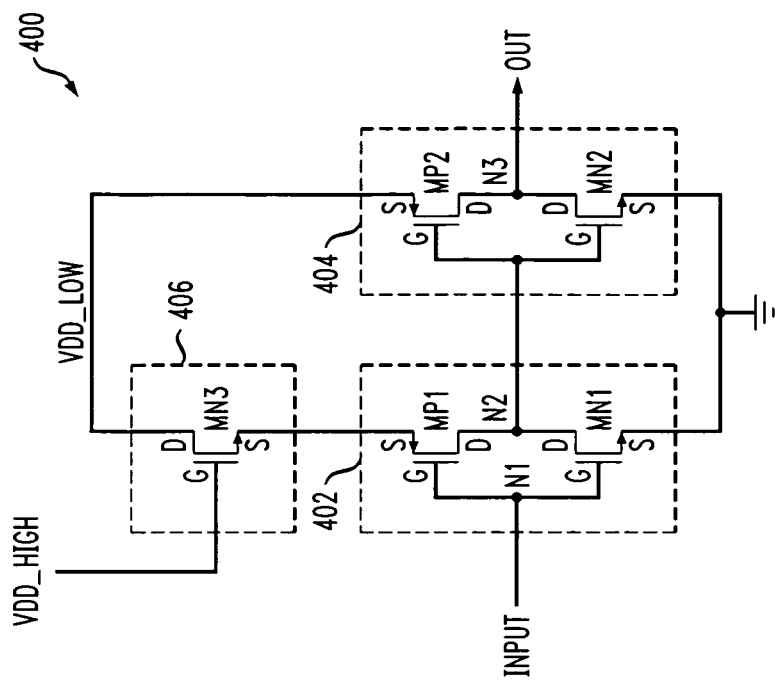
FIG. 3 is a schematic diagram depicting an illustrative buffer circuit with enhanced delay matching, formed in accordance with one embodiment of the present invention.

FIG. 3 illustrates a buffer circuit 300, formed in accordance with one embodiment of the present invention. Buffer circuit 300 may be used to implement matching buffer 106 depicted in FIG. 1, although buffer circuit 300 is not limited to use in this particular application. Buffer circuit 300 comprises one or more stages, such as an input stage 302 and an output stage 304 connected to the input stage. Each of the input stage 302 and output stage 304 may comprise an inverter. Specifically, input stage 302 preferably includes a low-voltage PMOS device, MP1, and a low-voltage NMOS device, MN1. A source of device MP1 is adapted for connection to a first supply voltage, which may be a core supply voltage, VDD_LOW, a gate of MP1 is connected to a gate of device MN1 and forms an input of the buffer circuit 300 at node N1, and a drain of MP1 is connected to a drain of MN1 and forms an output of input stage 302 at node N2. Likewise, output stage 304 preferably includes a low-voltage PMOS device, MP2, and a low-voltage NMOS device, MN2. A source of device MP2 is adapted for connection to the core supply voltage VDD_LOW, gates of MP2 and device MN2 are connected to the output of input stage 302 at node N2, and a drain of MP2 is connected to a drain of MN2 and forms an output of the buffer circuit 300 at node N3. Although not shown, those skilled in the art will appreciate that buffer circuit 300 may include one or more additional stages (e.g., inverting or non-inverting buffers) connected between the input stage 302 and the output stage 304 as may be necessary, for example, for selectively adjusting a delay of the buffer circuit.

The exemplary buffer circuit 300 further includes a delay control circuit 306. Delay control circuit 306, in one illustrative embodiment, comprises a high-voltage NMOS device, MN3, coupled between the input stage 302 and ground, or an alternative voltage return of the buffer circuit 300. Specifically, a drain of device MN3 is connected to a source of device MN1 in the input stage 302, a source of MN3 is adapted for connection to ground, and a gate of MN3 is preferably adapted for connection to a second supply voltage, which may be IO supply voltage, VDD_HIGH. As the name suggests, VDD_HIGH is preferably greater than VDD_LOW. In a preferred embodiment, VDD_HIGH is about 3.3 volts and VDD_LOW is about 1.0 volt, although the first and second supply voltages are not limited to any particular voltage levels. It is to be understood that the delay control circuit 306 is not limited to the particular arrangement shown.

Device MN3 in the delay control circuit 306 is preferably configured to operate in a "triode region," also referred to as a "linear region" or "resistive region" of the device. As the IO supply voltage VDD_HIGH is increased, an effective resistance of device MN3 will decrease, thereby decreasing the delay of the buffer circuit 300. Thus, the delay of the buffer circuit 300 can be selectively controlled as a function of the IO supply voltage VDD_HIGH. The effective resistance of device MN3, and therefore the delay of the buffer circuit 300, will also be a function of one or more high-voltage NMOS process parameters (e.g., threshold voltage). Delay control circuit 306 provides correlation of rising edge-to-rising edge delay between input buffer 104 and matching buffer 106, respectively, shown in FIG. 1. The rising edge-to-rising edge delay of a buffer circuit may be defined herein as the delay between a rising edge (e.g., low-to-high transition) of an input signal, INPUT, presented to the buffer circuit and a corresponding rising edge of an output signal, OUTPUT, generated by the buffer circuit. Since the delay of the input buffer depends primarily on process parameters of the high-voltage transistor devices utilized therein and on the IO supply voltage (e.g., VDD_HIGH), delay control circuit 306 is preferably operative to allow the delay of the buffer circuit 300 to be at least partially controlled as a function of high-voltage NMOS process variation and/or IO supply voltage variation.

Figure 4:
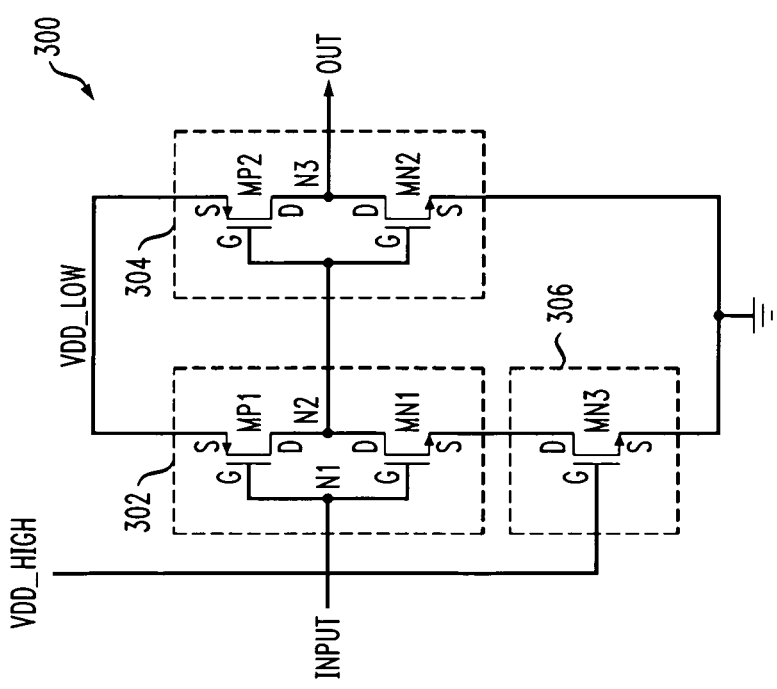
FIG. 4 is a schematic diagram depicting an illustrative buffer circuit with enhanced delay matching, formed in accordance with a second embodiment of the present invention.

Because of the connection of the delay control circuit 306 in series with the NMOS device MN1, the rising edge of an output signal, OUT, generated by the buffer circuit 300 will be primarily controlled as a function of variations in high-voltage NMOS process parameters and/or IO supply voltage. FIG. 4 illustrates an exemplary buffer circuit 400 wherein a falling edge of an output signal, OUT, generated by the buffer circuit 400 will be primarily controlled as a function of variations in one or more high-voltage NMOS process parameters and/or the 10 supply voltage, in accordance with another aspect of the invention.

Buffer circuit 400 comprises an input stage 402, an output stage 404 coupled to the input stage, and a delay control circuit 406. The input stage 402 and output stage 404 may be formed in a manner similar to the input stage 302 and output stage 304 of buffer circuit 300 shown in FIG. 3, except for the arrangement of the delay control circuit. Specifically, input stage 402 preferably includes a low-voltage PMOS device, MP1, and a low-voltage NMOS device, MN1. A source of device MN1 is adapted for connection to a voltage return of the buffer circuit 400, which may ground, a gate of device MP1 is connected to a gate of MN1 and forms an input of the buffer circuit 400 at node N1, and a drain of MP1 is connected to a drain of MN1 and forms an output of input stage 402 at node N2. Likewise, output stage 404 preferably includes a low-voltage PMOS device, MP2, and a low-voltage NMOS device, MN2. A source of device MP2 is adapted for connection to the core supply voltage VDD_LOW, gates of MP2 and device MN2 are connected to the output of input stage 402 at node N2, and a drain of MP2 is connected to a drain of MN2 and forms an output of the buffer circuit 400 at node N3. Buffer circuit 400 may include one or more additional stages (e.g., inverting or non-inverting buffers) connected between the input stage 402 and the output stage 404 as may be necessary, for example, for selectively adjusting a delay of the buffer circuit.

Delay control circuit 406 preferably comprises a high-voltage NMOS device, MN3, coupled between the input stage 402 and the core logic supply voltage VDD_LOW, or an alternative supply voltage. Specifically, a drain of device MN3 is adapted for connection to VDD_LOW, a source of MN3 is connected to a source of device MP1, and a gate of MN3 is preferably adapted for connection to IO supply voltage, VDD_HIGH. As in the delay control circuit 306 depicted in FIG. 3, device MN3 in the delay control circuit 406 is preferably configured to operate in the triode region. As the IO supply voltage VDD_HIGH is increased, an effective resistance of device MN3 will decrease, thereby decreasing the delay of the buffer circuit 400. Thus, the delay of the buffer circuit 400 can be selectively controlled as a function of the IO supply voltage VDD_HIGH. The effective resistance of device MN3, and therefore the delay of the buffer circuit 400, will also be a function of one or more high-voltage NMOS process parameters (e.g., threshold voltage). Delay control circuit 406 provides correlation of falling edge-to-falling edge delay between the input buffer 104 and matching buffer 106, respectively, shown in FIG. 1. The falling edge-to-falling edge delay of a buffer circuit may be defined herein as the delay between a falling edge (e.g., high-to-low transition) of an input signal, INPUT, presented to the buffer circuit and a corresponding falling edge of an output signal, OUTPUT, generated by the buffer circuit. Since the delay of the input buffer depends primarily on process parameters of the high-voltage transistor devices utilized therein and on the IO supply voltage (e.g., VDD_HIGH), delay control circuit 406 is preferably operative to allow the delay of the buffer circuit 400 to be at least partially controlled as a function of variations in one or more PVT conditions (e.g., IO supply voltage level, high-voltage NMOS process parameters, temperature) to which the buffer circuit 400 may be subjected.

Figure 5:
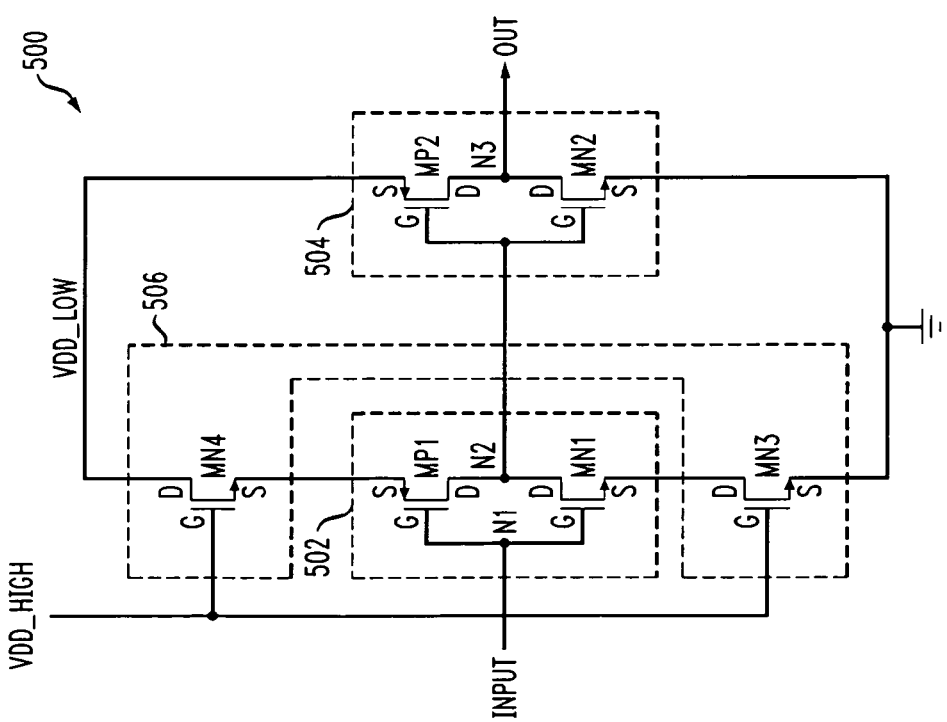
FIG. 5 is a schematic diagram depicting an illustrative buffer circuit with enhanced delay matching, formed in accordance with a third embodiment of the present invention.

FIG. 5 depicts an exemplary buffer circuit 500, formed in accordance with another embodiment of the invention. Buffer circuit 500 preferably comprises an input stage 502, an output stage 504 and a delay control circuit 506. Input stage 502 preferably includes a low-voltage PMOS device, MP1, and a low-voltage NMOS device, MN1, configured such that gates of MP1 and MN1 are connected together and form an input of the buffer circuit 500 at node N1, and drains of MP1 and MN1 are connected together to form an output of the input stage 502 at node N2. Output stage 504 preferably includes a low-voltage PMOS device, MP2, and a low-voltage NMOS device, MN2. A source of device MP2 is adapted for connection to core logic supply voltage, VDD_LOW, a source of device MN2 is adapted for connection to ground, or an alternative voltage return of the buffer circuit, gates of MP2 and MN2 are connected to the output of input stage 502 at node N2, and drains of MP2 and MN2 are connected together and form an output of the buffer circuit 500 at node N3.

The delay control circuit 506 preferably includes a first high-voltage NMOS device, MN3, having a source adapted for connection to ground, a gate adapted for connection to the higher IO supply voltage, VDD_HIGH, and a drain connected to a source of device MN1. Delay control circuit 506 further includes a second high-voltage NMOS device, MN4, having a source connected to a source of device MP1, a gate adapted for connection to IO supply voltage VDD_HIGH, and a drain adapted for connection to core logic supply voltage VDD_LOW. Each of devices MN3 and MN4 are preferably operated in the triode region. As the IO supply voltage VDD_HIGH is increased, an effective resistance of devices MN3 and MN4 will decrease, thereby decreasing the delay of the buffer circuit 500. The delay of the buffer circuit 500 can therefore be selectively controlled as a function of VDD_HIGH. The effective resistance of devices MN3 and MN4, and therefore the delay of the buffer circuit 500, will also be a function of one or more high-voltage NMOS process parameters (e.g., threshold voltage). Buffer circuit 500 is similar to buffer circuits 300 and 400 depicted in FIGS. 3 and 4, respectively, except that delay control circuit 506 is operative to control both rising edge-to-rising edge delay and falling edge-to-falling edge delay in the buffer circuit 500 as a function of variations in one or more PVT conditions (e.g., IO supply voltage level, process parameters, temperature) to which the buffer circuit 500 may be subjected.

Figure 6:
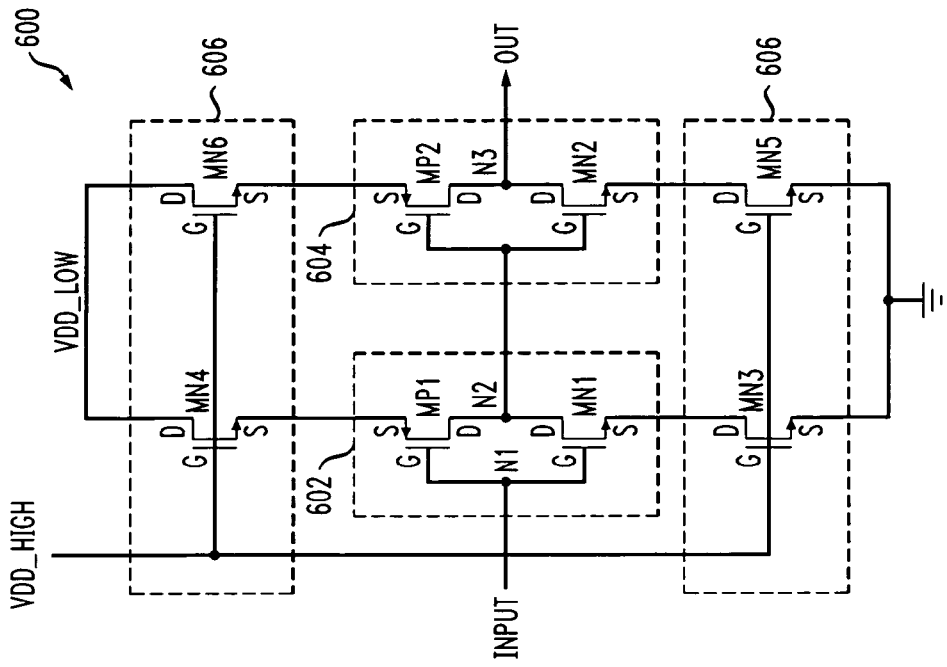
FIG. 6 is a schematic diagram depicting an illustrative buffer circuit with enhanced delay matching, formed in accordance with a fourth embodiment of the present invention.

FIG. 6 is a schematic diagram depicting an exemplary buffer circuit 600 which provides even more delay control, in accordance with another embodiment of the invention. Buffer circuit 600 preferably includes an input stage 602 comprising low-voltage MOS devices, an output stage 604 coupled to the input stage, the output stage comprising low-voltage MOS devices, and a delay control circuit 606. In this embodiment, the delay control circuit 606 is connected between the supply voltage and voltage return of both the input stage 602 and the output stage 604. in this manner, both the rising edge-to-rising edge delay and the falling edge-to-falling edge delay of the input stage 602 and output stage 604 can be selectively controlled as a function of variations in one or more PVT conditions (e.g., IO supply voltage level, process parameters, temperature) to which the buffer circuit 600 may be subjected.

Specifically, the input stage 602 preferably includes a low-voltage PMOS device, MP1, and a low-voltage NMOS device, MN1, connected such that gates of MP1 and MN1 are connected together and form an input of the buffer circuit 600 at node N1, and drains of MP1 and MN1 are connected together to form an output of the input stage 602 at node N2. Output stage 604 preferably includes a low-voltage PMOS device, MP2, and a low-voltage NMOS device, MN2, connected such that gates of MP2 and MN2 are connected to the output of input stage 602 at node N2, and drains of MP2 and MN2 are connected together and form an output of the buffer circuit 600 at node N3.

Delay control circuit 606 preferably includes first, second, third and fourth high-voltage NMOS devices MN3, MN4, MN5 and MN6, respectively. A source of device MN3 is preferably adapted for connection to ground, or an alternative voltage return, a drain of MN3 is connected to a source of device MN1 in the input stage 602, and a gate of MN3 is adapted for connection to IO supply voltage, VDD_HIGH. A drain of device MN4 is preferably adapted for connection to core supply voltage, VDD_LOW, a source of MN4 is connected to a source of device MP1 in the input stage 602, and a gate of MN4 is adapted for connection to VDD_HIGH. A source of device MN5 is preferably adapted for connection to ground, a drain of MN5 is connected to a source of device MN2 in the output stage 604, and a gate of MN5 is adapted for connection to VDD_HIGH. A drain of device MN6 is preferably adapted for connection to VDD_LOW, a source of MN6 is connected to a source of device MP2 in the output stage 604, and a gate of MN6 is adapted for connection to VDD_HIGH. Each of devices MN3, MN4, MN5 and MN6 are preferably operated in the triode region.

As the IO supply voltage VDD_HIGH is increased, an effective resistance of devices MN3, MN4, MN5 and MN6 will decrease, thereby decreasing the delay of the buffer circuit 600. The delay of the buffer circuit 600 can therefore be selectively controlled as a function of VDD_HIGH. The effective resistance of devices MN3, MN4, MN5 and MN6, and therefore the delay of the buffer circuit 600, will also be a function of one or more high-voltage NMOS process parameters (e.g., threshold voltage). Like buffer circuit 500 shown in FIG. 5, buffer circuit 600 is operative to control both rising edge-to-rising edge delay and falling edge-to-falling edge delay in the buffer circuit 600 as a function of variations in one or more PVT conditions (e.g., IO supply voltage level, process parameters, temperature) to which the buffer circuit 600 may be subjected.

In one or more of the buffer circuits described above in conjunction with FIGS. 3 through 6, by making the low-voltage MOS devices in the input and output stages have a substantially larger transconductance than an effective conductance of the high-voltage MOS device(s) in the delay control circuits, the delay through the respective buffer circuits is primarily controlled by variations in one or more high-voltage MOS process parameters. This can be accomplished, for example, by appropriately selecting a channel width-to-length (W/L) ratio for each of the devices relative to one another, such that the high-voltage NMOS device(s) in the respective delay control circuits are substantially smaller than the low-voltage devices in the input and output stages of the buffer circuits.

At least a portion of the methodologies of the present invention may be implemented in an integrated circuit. In forming integrated circuits, a plurality of identical die is typically fabricated in a repeated pattern on a surface of a semiconductor wafer. Each die includes a device described herein, and may include other structures and/or circuits. The individual die are cut or diced from the wafer, then packaged as an integrated circuit. One skilled in the art would know how to dice wafers and package die to produce integrated circuits. Integrated circuits so manufactured are considered part of this invention.

Although illustrative embodiments of the present invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. A buffer circuit, comprising:
an input stage including at least one metal-oxide-semiconductor (MOS) device having a first threshold voltage associated therewith, the input stage being adapted to receive an input signal referenced to a first voltage supply;
an output stage including at least one MOS transistor having the first threshold voltage associated therewith, an input of the output stage being connected to an output of the input stage, the output stage being operative to generate an output signal which is indicative of a logic state of the input signal; and
a delay control circuit adapted for connection between at least one of: (i) the input stage and at least one of the first voltage supply and a voltage return of the buffer circuit; and (ii) the output stage and at least one of the first voltage supply and the voltage return of the buffer circuit, the delay control circuit being connected outside a signal path of the buffer circuit, the delay control circuit comprising at least one MOS device having a second threshold voltage associated therewith, the second threshold voltage being greater than the first threshold voltage, the at least one MOS device in the delay control circuit receiving, as a control signal, a second voltage supply, the second voltage supply being independent of the first voltage supply and the voltage return of the buffer circuit, a delay of the buffer circuit being at least partially controlled as a function of at least one of a process parameter, the second voltage supply and a temperature of the at least one MOS device in the delay control circuit.

2. The buffer circuit of claim 1, wherein the delay control circuit comprises an N-channel MOS (NMOS) device having the second threshold voltage associated therewith and including a first source/drain adapted for connection to the first voltage supply, a second source/drain connected to the input stage, and a gate adapted for connection to the second voltage supply.

3. The buffer circuit of claim 1, wherein the delay control circuit comprises an NMOS device having the second threshold voltage associated therewith and including a first source/drain adapted for connection to the voltage return of the buffer circuit, a second source/drain connected to the input stage, and a gate adapted for connection to the second voltage supply.

4. The buffer circuit of claim 1, wherein the delay control circuit comprises an NMOS device having the second threshold voltage associated therewith and including a first source/drain adapted for connection to the first voltage supply, a second source/drain connected to the output stage, and a gate adapted for connection to the second voltage supply.

5. The buffer circuit of claim 1, wherein the delay control circuit comprises an NMOS device having the second threshold voltage associated therewith and including a first source/drain adapted for connection to the voltage return of the buffer circuit, a second source/drain connected to the output stage, and a gate adapted for connection to the second voltage supply.

6. The buffer circuit of claim 1, wherein the delay control circuit comprises:
a first NMOS device having the second threshold voltage associated therewith and including a first source/drain adapted for connection to the voltage return of the buffer circuit, a second source/drain connected to a first node of the input stage, and a gate adapted for connection to the second voltage supply, a fall time of the output signal being controlled at least in part as a function of at least one of the second voltage supply and one or more characteristics of the first NMOS device; and
a second NMOS device having the second threshold voltage associated therewith and including a first source/drain adapted for connection to the first voltage supply, a second source/drain connected to a second node of the input stage, and a gate adapted for connection to the second voltage supply, a rise time of the output signal being controlled at least in part as a function of at least one of the second voltage supply and one or more characteristics of the second NMOS device.

7. The buffer circuit of claim 1, wherein the delay control circuit comprises:
a first NMOS device having the second threshold voltage associated therewith and including a first source/drain adapted for connection to the voltage return of the buffer circuit, a second source/drain connected to a first node of the input stage, and a gate adapted for connection to the second voltage supply, a fall time of the output signal being controlled at least in part as a function of at least one of the second voltage supply and one or more characteristics of the first NMOS device;
a second NMOS device having the second threshold voltage associated therewith and including a first source/drain adapted for connection to the first voltage supply, a second source/drain connected to a second node of the input stage, and a gate adapted for connection to the second voltage supply, a rise time of the output signal being controlled at least in part as a function of at least one of the second voltage supply and one or more characteristics of the second NMOS device;
a third NMOS device having the second threshold voltage associated therewith and including a first source/drain adapted for connection to the voltage return of the buffer circuit, a second source/drain connected to a first node of the output stage, and a gate adapted for connection to the second voltage supply, a fall time of the output signal being controlled at least in part as a function of at least one of the second voltage supply and one or more characteristics of the third NMOS device; and
a fourth NMOS device having the second threshold voltage associated therewith and including a first source/drain adapted for connection to the first voltage supply, a second source/drain connected to a second node of the output stage, and a gate adapted for connection to the second voltage supply, a rise time of the output signal being controlled at least in part as a function of at least one of the second voltage supply and one or more characteristics of the fourth NMOS device.

8. The buffer circuit of claim 7, wherein the MOS devices in the input stage and output stage are sized to have a substantially greater transconductance than an effective conductance of each of the first, second, third and fourth NMOS devices in the delay control circuit, such that a delay through the buffer circuit is primarily controlled by at least one of the second voltage supply and one or more process, voltage and temperature variations of the first, second, third and fourth NMOS devices.

9. The buffer circuit of claim 1, wherein the input stage comprises an NMOS device and a P-channel MOS (PMOS) device connected together in an inverter configuration, the NMOS and PMOS devices each having the first threshold voltage associated therewith.

10. The buffer circuit of claim 1, wherein the output stage comprises an NMOS device and a PMOS device connected together in an inverter configuration, the NMOS and PMOS devices each having the first threshold voltage associated therewith.

11. The buffer circuit of claim 1, wherein the second voltage supply is substantially greater than the first voltage supply.

12. The buffer circuit of claim 1, further comprising at least one intermediate buffer stage including an input connected to the output of the input stage and an output connected to the input of the output stage.

13. The buffer circuit of claim 1, wherein the second voltage supply is substantially equal to about 3.3 volts and the first voltage supply is substantially equal to about 1.0 volt.

14. An integrated circuit including at least one buffer circuit, the at least one buffer circuit comprising:
an input stage including at least one metal-oxide-semiconductor (MOS) device having a first threshold voltage associated therewith, the input stage being adapted to receive an input signal referenced to a first voltage supply;

an output stage including at least one MOS transistor having the first threshold voltage associated therewith, an input of the output stage being connected to an output of the input stage, the output stage being operative to generate an output signal which is indicative of a logic state of the input signal; and a delay control circuit adapted for connection between at least one of: (i) the input stage and at least one of the first voltage supply and a voltage return of the buffer circuit; and (ii) the output stage and at least one of the first voltage supply and the voltage return of the buffer circuit, the delay control circuit being connected outside a signal path of the buffer circuit, the delay control circuit comprising at least one MOS device having a second threshold voltage associated therewith, the second threshold voltage being greater than the first threshold voltage, the at least one MOS device in the delay control circuit receiving, as a control signal, a second voltage supply, the second voltage supply being independent of the first supply voltage and the voltage return of the buffer circuit, a delay of the buffer circuit being at least partially controlled as a function of at least one of a process parameter, the second voltage supply and a temperature of the at least one MOS device in the delay control circuit.

* * * * *